(12) United States Patent
Urano et al.

(10) Patent No.: US 10,727,024 B2
(45) Date of Patent: Jul. 28, 2020

(54) CHARGED PARTICLE BEAM DEVICE AND ABERRATION CORRECTION METHOD FOR CHARGED PARTICLE BEAM DEVICE

(71) Applicant: HITACHI HIGH-TECHNOLOGIES CORPORATION, Tokyo (JP)

(72) Inventors: Kotoko Urano, Tokyo (JP); Zhaohui Cheng, Tokyo (JP); Takeyoshi Ohashi, Tokyo (JP); Hideyuki Kazumi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/325,613

(22) PCT Filed: Aug. 23, 2016

(86) PCT No.: PCT/JP2016/074481
§ 371 (c)(1),
(2) Date: Feb. 14, 2019

(87) PCT Pub. No.: WO2018/037474
PCT Pub. Date: Mar. 1, 2018

(65) Prior Publication Data
US 2019/0214222 A1 Jul. 11, 2019

(51) Int. Cl.
*H01J 37/153* (2006.01)
*H01J 37/22* (2006.01)
*H01J 37/244* (2006.01)

(52) U.S. Cl.
CPC .......... *H01J 37/153* (2013.01); *H01J 37/222* (2013.01); *H01J 37/244* (2013.01); *H01J 2237/1534* (2013.01); *H01J 2237/2448* (2013.01)

(58) Field of Classification Search
CPC ...... H01J 37/153; H01J 37/222; H01J 37/244; H01J 37/304; H01J 2237/1534; H01J 2237/2448
See application file for complete search history.

(56) References Cited

U.S. PATENT DOCUMENTS

2005/0156117 A1* 7/2005 Uno .................. H01J 37/153
250/396 R
2005/0189496 A1 9/2005 Uno
(Continued)

FOREIGN PATENT DOCUMENTS

JP 2005-183085 A 7/2005
JP 2005-183086 A 7/2005
(Continued)

OTHER PUBLICATIONS

International Search Report for PCT/JP2016/074481, dated Nov. 22, 2016.

*Primary Examiner* — David E Smith
(74) *Attorney, Agent, or Firm* — Volpe and Koenig, P.C.

(57) ABSTRACT

A charged particle beam device using a multi-pole type aberration corrector includes: a charged particle source which generates a primary charged particle beam; an aberration correction optical system which corrects aberrations of the primary charged particle beam; a detection unit which detects a secondary charged particle generated from a sample irradiated with the primary charged particle beam whose aberrations have been corrected; an image forming unit which forms a charged particle image of the sample from a signal obtained by detecting the secondary charged particle; an aberration correction amount calculation unit which processes the charged particle image, separates aberrations having different symmetries, selects an aberration to be preferentially corrected from the separated aberrations, and calculates a correction amount of the aberration correc- (Continued)

tion optical system; and an aberration correction optical system control unit which controls the aberration correction optical system based on the calculated correction amount.

12 Claims, 8 Drawing Sheets

(56) References Cited

U.S. PATENT DOCUMENTS

| | | | |
|---|---|---|---|
| 2006/0033037 A1* | 2/2006 | Kawasaki | H01J 37/1478 250/398 |
| 2006/0054837 A1 | 3/2006 | Uno | |
| 2009/0212228 A1* | 8/2009 | Hirose | H01J 37/153 250/396 R |
| 2014/0231666 A1* | 8/2014 | Akima | H01J 37/153 250/396 R |
| 2015/0060654 A1* | 3/2015 | Urano | H01J 37/153 250/252.1 |

FOREIGN PATENT DOCUMENTS

| | | |
|---|---|---|
| JP | 2006-085919 A | 3/2006 |
| JP | 2009-199904 A | 9/2009 |
| JP | 2013-030278 A | 2/2013 |

* cited by examiner

CHARGED PARTICLE BEAM DEVICE AND ABERRATION CORRECTION METHOD FOR CHARGED PARTICLE BEAM DEVICE

TECHNICAL FIELD

The present invention relates to a charged particle beam device and an aberration correction method for the charged particle beam device.

BACKGROUND ART

In a device (charged particle beam device) using a convergent charged particle beam (probe beam) such as a scanning electron microscope (SEM) and an ion beam processing device (Focused Ion Bear: FIB), a sample is scanned with the probe beam, so that an observation image or the sample is processed. A resolution or processing precision of the charged particle beam device is determined by a cross-section size (probe diameter) of the probe beam and in principle, when the cross-section size is small, the resolution or the processing precision can be increased.

Recently, the development of an aberration corrector for the charged particle beam device has been advanced and its practical application has been advanced. In the aberration corrector, a resultant obtained by stacking multi-pole lenses including magnetic poles or electrodes in multiple stages is used. Each stage applies a rotationally asymmetric electric field/magnetic field such as a 2-pole field, a 4-pole field, a 6-pole field, and a 8-pole field to the beam in a superposed manner and gives a counter aberration to the probe beam.

As a result, the aberration corrector can cancel various aberrations such as a spherical aberration and a chromatic aberration occurring in an objective lens of an optical system, a deflection lens, or the like. In addition, aberrations caused by the rotationally asymmetric field of the aberration corrector as a dominant factor, for example, a two-fold symmetric astigmatism, a three-fold symmetric astigmatism, a coma aberration, a four-fold symmetric astigmatism, a star aberration, and the like can be adjusted in the corrector.

In order to maximize device performance in a charged particle beam application device including the aberration corrector, by appropriately adjusting the aberration corrector including the aberrations occurring in the corrector, influences of all aberration components must be removed from the probe beam.

In the adjustment of the aberration corrector, since the number of power supplies of multi-poles constituting the corrector is large and the adjustment work is complicated, automation for quantifying the aberrations included in the optical system, calculating a feedback amount to cancel each aberration for each of the aberrations, and applying feedback to the device is attempted.

An example of an aberration evaluation method in the charged particle beam device including the aberration corrector is disclosed in PTL 1. PTL 1 discloses a method of measuring the aberrations from an SEM image. Thereby, an aberration coefficient representing the magnitude of each aberration can be evaluated.

PTL 2 discloses that, in a transmission electron microscope (TEM) and a scanning transmission electron microscope (STEM) mounted with a conventional aberration corrector, a correction target value is determined for each aberration with respect to each aberration coefficient using the Rayleigh's quarter-wave rule, for example, and while the aberration corrector is adjusted so that the aberration becomes the target value or less, a wavefront phase shift of an electron beam due to the aberration is observed by a transmission electron image called Ronchigram and an aberration correction amount is confirmed.

On the other hand, in the charged particle beam device such as the SEM, a method of determining an image resolution of the SEM by evaluating a sample image scanned with the probe beam is known.

CITATION LIST

Patent Literature

PTL 1: JP 5028297 B2
PTL 2: JP 2013-030278 A

SUMMARY OF INVENTION

Technical Problem

As described above, the adjustment work of the aberration corrector can be performed by measuring the aberrations from the SEM image, measuring the aberration coefficients showing the magnitudes of the aberrations included in the optical system, and feeding a measurement result back to the device.

On the other hand, in the charged particle beam device such as the SEM, the aberrations act on the probe beam shape in a superposed manner, the beam diameter and shape are determined by the influences of all the aberrations, the sample is scanned with the beam, and the scanned image is evaluated to determine the image resolution of the SEM. Therefore, in the charged particle beam device mounted with the aberration corrector, the aberrations of the optical system including the rotationally asymmetric aberration occurring in the aberration corrector are involved in an image resolution. However, a relation between the aberration coefficient and the image resolution is not yet clarified.

For example, even in the correction procedure of PTL 2, the aberration correction is merely continued until the resolution becomes the target resolution and objects to be reinforced and learned, that is, values and rewards described in PTL 2 are only based on the individual aberration amounts.

For this reason, there is no method of comparing and determining the magnitudes of the influences of the individual aberrations obtained by the aberration measurement on the image resolution between the aberrations and it is difficult to determine the aberration giving the largest influence on the current image resolution from the scanned image. For this reason, there is a problem that it is difficult to efficiently adjust the aberration corrector by selecting the aberration giving the large influence on image resolution degradation and it takes time to adjust the aberration corrector.

The present invention solves the conventional problems described above and provides a charged particle beam device capable of efficiently improving an image resolution and quickly completing adjustment of an aberration corrector.

Solution to Problem

To solve the above problems, in the present invention, a charged particle beam device is configured to include: a charged particle source which generates a primary charged particle beam; an aberration correction optical system which corrects aberrations of the primary charged particle beam generated from the charged particle source; a detection unit which detects a secondary charged particle generated from a sample irradiated with the primary charged particle beam whose aberrations have been corrected by the aberration correction optical system; an image forming unit which forms a charged particle image of the sample from a signal obtained by detecting the secondary charged particle by the detection unit; an aberration correction amount calculation unit which processes the charged particle image formed by the image forming unit, separates aberrations having different symmetries in the primary charged particle beam, selects an aberration to be preferentially corrected from the separated aberrations, and calculates a correction amount of the aberration correction optical system for correcting the selected aberration; and an aberration correction optical system control unit which controls the aberration correction optical system on the basis of the correction amount calculated by the aberration correction amount calculation unit.

Further, to solve the above problems, in the present invention, a charged particle beam device is configured to include: a charged particle source which generates a primary charged particle beam; an aberration correction optical system including a multi-pole lens which corrects aberrations of the primary charged particle beam generated from the charged particle source; a detection unit which detects a secondary charged particle generated from a sample irradiated with the primary charged particle beam whose aberrations have been corrected by the aberration correction optical system; an image forming unit which forms a charged particle image of the sample from a signal obtained by detecting the secondary charged particle by the detection unit; an aberration correction amount calculation unit which processes the charged particle image formed by the image forming unit, extracts an aberration to be preferentially corrected in the aberration correction optical system, and calculates a correction amount of the extracted aberration to be preferentially corrected; an aberration correction optical system control unit which controls the aberration correction optical system on the basis of the correction amount calculated by the aberration correction amount calculation unit; and an image processing unit which processes the charged particle image formed by the image forming unit from the signal obtained by detecting the secondary charged particle generated from the sample irradiated with the primary charged particle beam having passed through the aberration correction optical system controlled by the aberration correction optical system control unit by the detection unit and measures a dimension of a pattern formed on the sample.

Furthermore, to solve the above problems, in the present invention, an aberration correction method for a charged particle beam device includes: causing a detector to detect a secondary charged particle generated from a sample irradiated with a primary charged particle beam which has been generated from a charged particle source of the charged particle beam device and has passed through an aberration correction optical system; causing an image forming unit to form a charged particle image of the sample from a signal obtained by detecting the secondary charged particle by the detector; causing an aberration correction amount calculation unit to process the charged particle image formed by the image forming unit, extract an aberration to be preferentially corrected in the aberration correction optical system, and calculate a correction amount of the extracted aberration to be preferentially corrected; and controlling the aberration correction optical system on basis of the correction amount of the aberration to be preferentially corrected, which has been calculated by the aberration correction amount calculation unit.

Advantageous Effects of Invention

According to the present invention, since it is possible to individually evaluate an influence of each measured aberration component on a beam diameter and an image resolution, it is possible to select and correct aberrations having a large effect on image resolution improvement. As a result, the image resolution can be efficiently improved and adjustment of an aberration corrector can be quickly completed.

Other objects, configurations, and effects will be apparent from the following description of embodiments.

DESCRIPTION OF EMBODIMENTS

Figure 1:
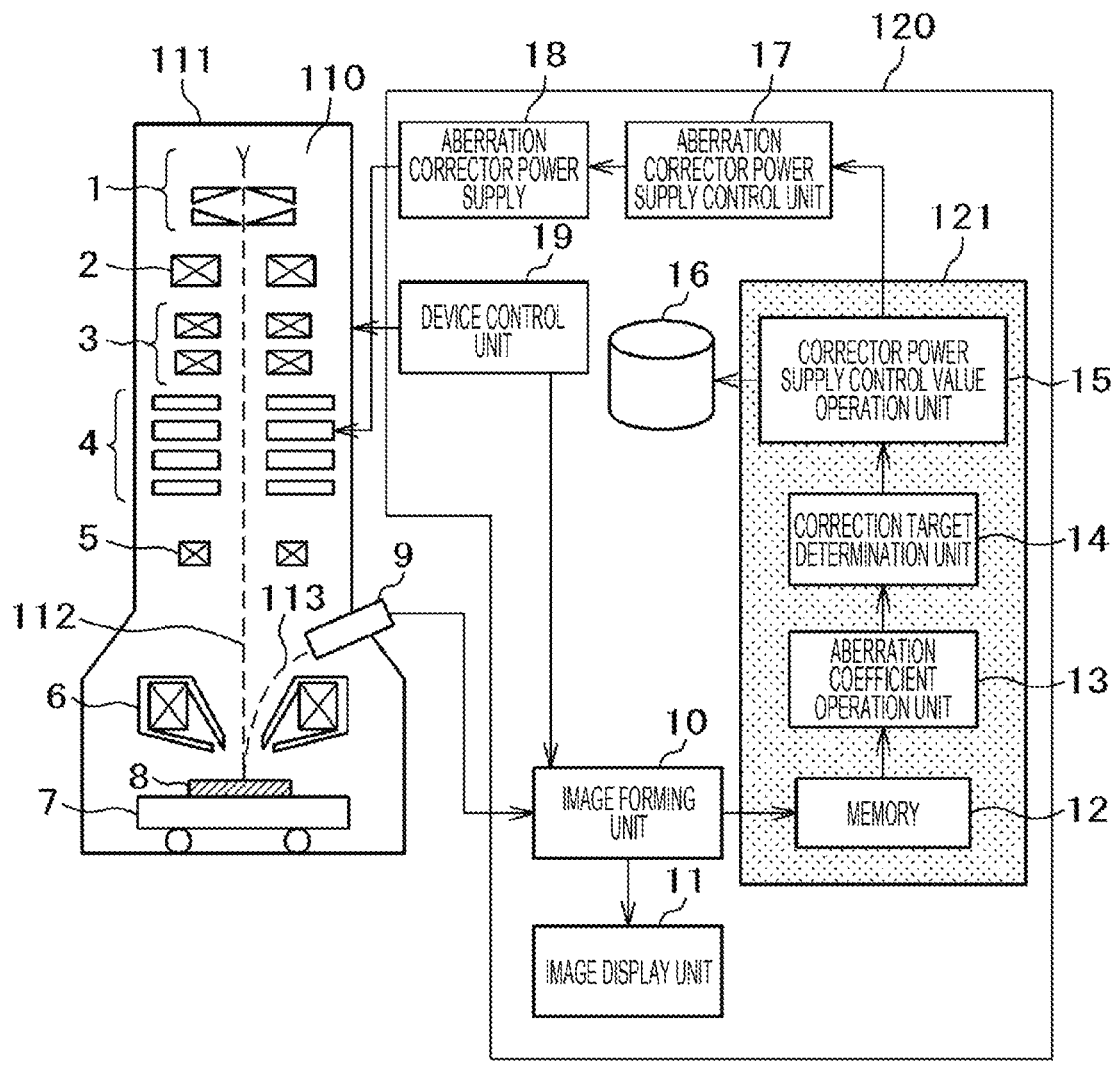
FIG. 1 is a block diagram showing a configuration of a charged particle beam device according to a first embodiment of the present invention.

The present invention relates to a charged particle beam device having an aberration correction optical system including a multi-pole lens. In the present invention, the charged particle beam device is configured to include a control unit for controlling the aberration correction optical system, a unit for separately measuring aberrations of a primary charged particle beam having different symmetries, a unit for calculating influence values on image degradation due to the aberrations of the primary charged particle beam measured by the measurement unit, and a control unit for controlling the aberration correction optical system on the basis of a calculation result of the calculation unit.

In the present invention, a contribution to an image resolution for each aberration component is considered and a parameter representing an influence of the aberration on the image resolution is determined and is used for determining aberration corrector adjustment.

In all the drawings for explaining the present embodiment, the same reference numerals are attached to those having the same function and the repetitive description thereof is omitted in principle. Embodiments of the present invention will be described in detail below on the basis of the drawings.

First Embodiment

[System Configuration]
FIG. 1 shows a schematic configuration of an SEM system 100 mounted with an aberration corrector. In the present embodiment, an SEM 110 mounted with an electromagnetic superposition type aberration corrector of a quadrupole-octupole system and a control system 120 thereof will be described.

The SEM 110 includes an electron gun 1, a condenser lens 2, a deflection coil 3, an aberration corrector 4, a scanning coil 5, an objective lens 6, and a sample stand 7 in a column 111.

The control system 120 includes a control computer 121, an image forming unit 10, an image display unit 11, an aberration corrector power supply control unit 17, an aberration corrector power supply 18, and a device control unit 19. Further, the control computer 121 includes a memory 12, an aberration coefficient operation unit 13, a correction target determination unit 14, and a corrector power supply control value operation unit 15 and is connected to a table storage unit 16.

In the above configuration, an electron beam 112 emitted from the electron gun 1 in the column 111 of the SEM 110 passes through the condenser lens 2 and the deflection coil 3 of a two-stage configuration and is then incident on the aberration corrector 4. After passing through the aberration corrector 4 the scanning coil 5, and the objective lens 6, the electron beam 112 is irradiated on a surface of a sample 8 placed on the sample stand 7 to scan the surface of the sample 8.

Secondary charged particles 113 such as secondary electrons and reflected electrons are emitted from an irradiation point of the sample 8 by the electron beam 112. A part of the emitted secondary charged particles 113 is detected by a detector 9 and a detection result is output as a secondary charged particle signal to the image forming unit 10.

The image forming unit 10 is provided with processing circuits such as a signal amplification stage and a D/A converter. The secondary charged particle signal is converted into brightness distribution data (that is, image data (SEM image)) in the image forming unit 10 and is output to the image display unit 11. The image data (SEM image) is also sent from the image forming unit 10 to the control computer 101 and is accumulated in the memory 12.

The SEM system 100 according to the present embodiment has a configuration capable of inclining the electron beam 112 incident on an object point of the objective lens 6 with respect to an optical axis of the objective lens 6. For this configuration, the SEM 110 according to the present embodiment has the deflection coil 3 of the two-stage configuration at a position above the aberration corrector 4. The deflection coil 3 can cause a center axis of the electron beam 112 to have an inclination angle and an azimuth angle θ with respect to the optical axis of the objective lens 6.

Figure 2:
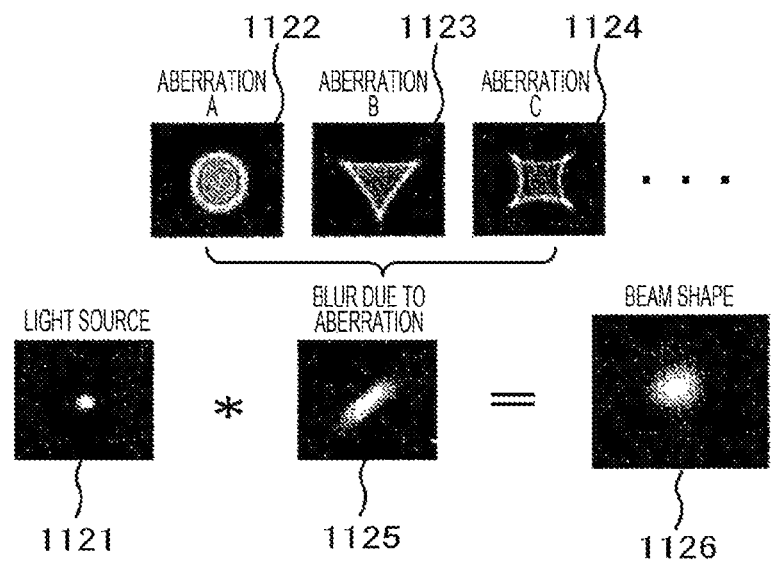
FIG. 2 is a cross-sectional view of a probe obligation showing a change due to aberrations in a cross-sectional shape of a probe beam for describing the principle of the present invention.

FIG. 2 schematically shows a change in the beam shape due to the aberrations. The electron beam 112 emitted from the electron gun 1 passes through the condenser lens 2 and the deflection coil 3 of the two-stage configuration and ideally becomes a beam having a cross-section shown by 1121. However, actually, aberrations occur due to various factors such as an aberration A: 1122, an aberration B: 1123, and an aberration C: 1124 and a blur 1125 due to the aberrations occurs, which affects the ideal beam shape 1121. As a result, the beam shape may become a beam shape including a blur component due to the aberrations as shown by 1126.

When the beam 1126 including the blur component as described above is used as a probe beam, an edge of a pattern of an obtained image is blurred, which results in an image with poor image sharpness. To acquire an SEM image with improved image sharpness, in the present embodiment, the aberration corrector 4 is used to reduce the aberrations occurring due to the various factors such as the aberration A: 1122, the aberration B: 1123, and the aberration C: 1124, thereby minimizing the occurrence of the blur 1125.

Figure 3:
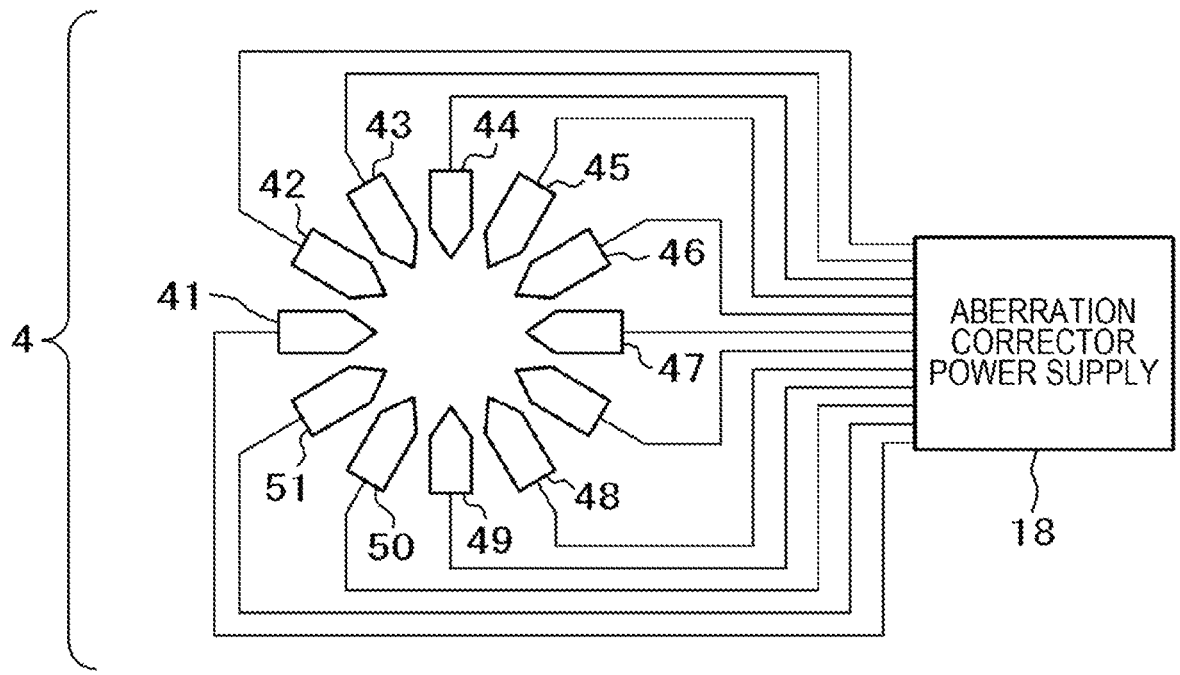
FIG. 3 is a plan view of a multi-pole lens of an aberration correction optical system of the charged particle beam device according to the first embodiment of the present invention.

FIG. 3 shows an example of a 12-pole aberration corrector as a configuration of the aberration corrector 4. The aberration corrector 4 has a configuration where electromagnetic lenses in which 12 electrodes and magnetic poles 41 to 51 are arranged at equal intervals on a concentric circle are stacked in multiple stages and the respective electrodes and magnetic poles are connected to the aberration corrector power supply 18.

Returning to the configuration of FIG. 1, the control computer 121 executes processing for calculating a control amount of the aberration corrector 4, on the basis of the image data accumulated in the memory 12. More specifically, control computer 121 executes processing for calculating a control amount to be given to the aberration corrector power supply control unit 20 that controls the aberration corrector power supply 18. Hereinafter, this processing operation will be described in detail.

The aberration coefficient operation unit 13 measures aberration coefficients on the basis of the image data accumulated in the memory 12 and transfers them to the correction target determination unit 14. A method of measuring the aberration coefficients using the image data is well known as described in PTL 1, for example. Therefore, the detailed description will be omitted here.

As the aberration coefficients to be measured by the aberration coefficient operation unit 13, there are aberration coefficients of various aberrations such as a spherical aberration C3 and a chromatic aberration CC occurring in the objective lens 6 or the deflection coil 3 of the optical system or a two-fold symmetric astigmatism A1, a three-fold symmetric astigmatism A2, a coma aberration B2, a four-fold symmetric astigmatism A3, a star aberration S3, and the like caused by a rotationally asymmetric field of the aberration corrector 4 as a dominant factor.

The correction target determination unit 14 selects the aberration to be preferentially corrected from the aberration coefficients calculated by the aberration coefficient operation unit 13 and supplies information of the selected aberration to the corrector power supply control value operation unit 15. Here, the aberration to be preferentially corrected is an aberration having a large effect on image degradation improvement by correction among the various aberrations, in this case, an aberration having a large effect on image resolution improvement. For example, an aberration in which a resolution influence value r to be described later is largest, an aberration in which the resolution influence value r exceeds a preset target value, or the like is used.

The corrector power supply control value operation unit 15 refers to a table 160 showing a correspondence relation between aberration amounts and aberration corrector power supply values, acquired in advance and stored in the table storage unit 16, and calculates a control value of the aberration corrector power supply 18 necessary for correcting the aberration to be corrected, output by the correction target determination unit 14. The calculated control value is fed back to the aberration corrector power supply 18 via the aberration corrector power supply control unit 17.

Figure 4:
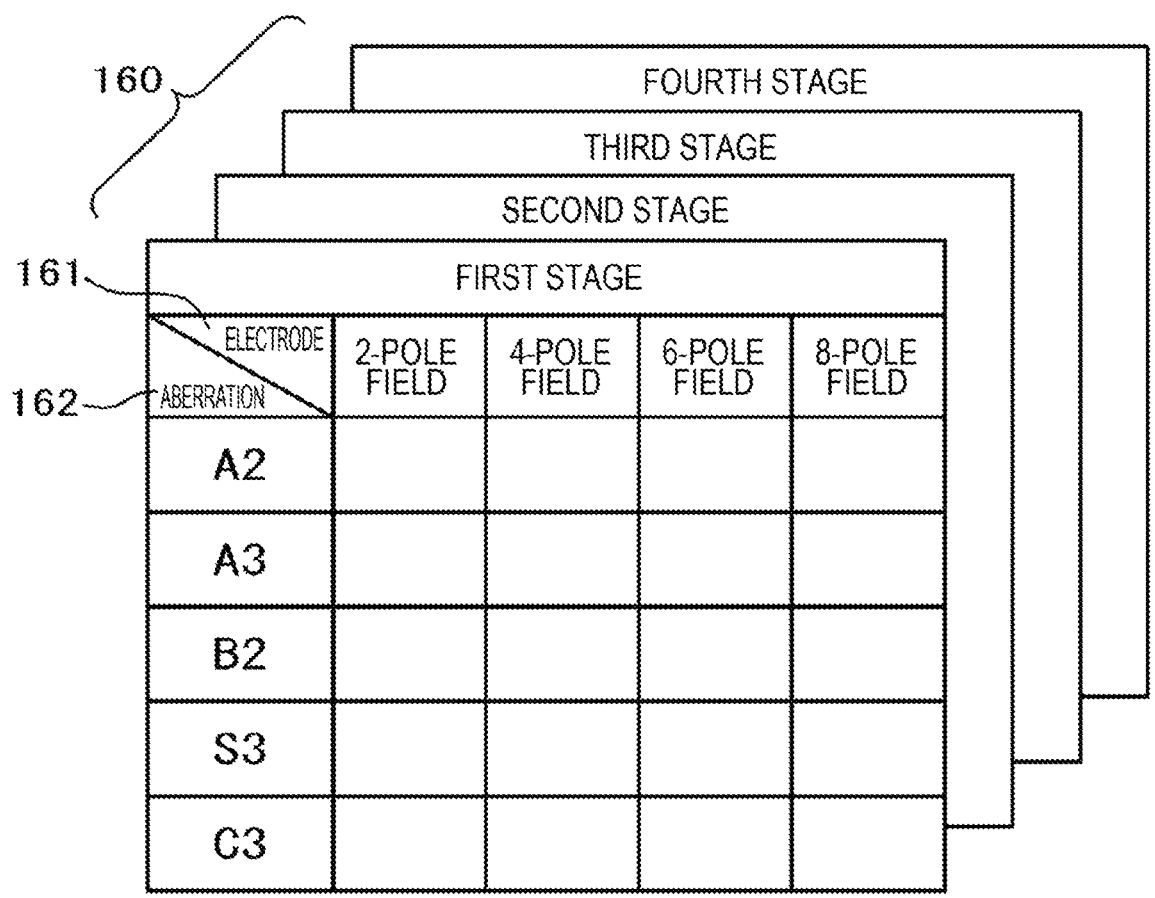
FIG. 4 is a table showing a correspondence relation of aberration amounts and aberration corrector power supply values stored in a table storage unit of the charged particle beam device according to the first embodiment of the present invention.

FIG. 4 shows an example of the table 160 showing the correspondence relation between the aberration amounts and the aberration corrector power supply values, stored in the table storage unit 16. In the table 160, a relation between electrodes 161 (8 poles in the example of FIG. 4) and aberrations 162 (5 types in the example of FIG. 4) is recorded for each stage (4 stages in the example of FIG. 4).

Figure 5:
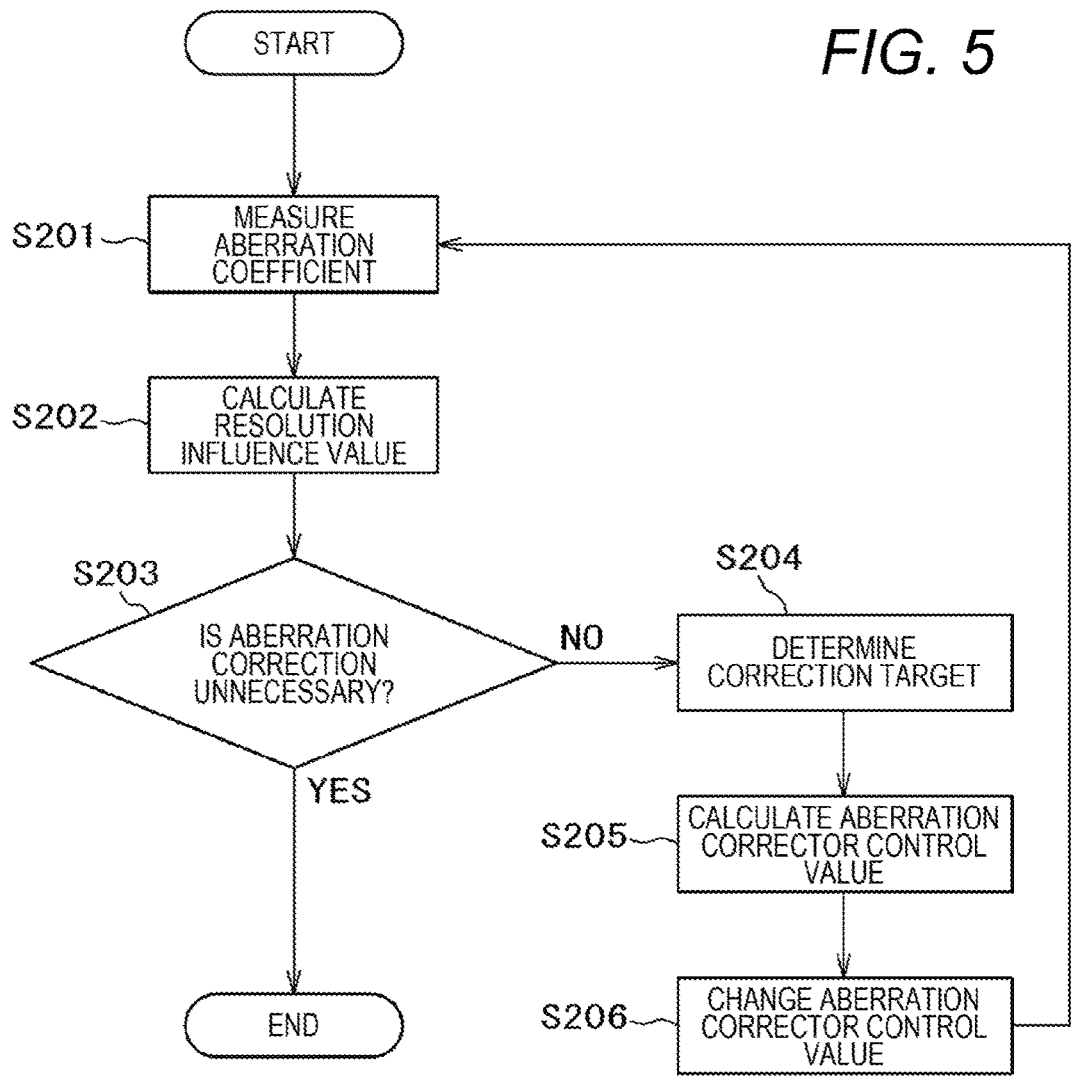
FIG. 5 is a flowchart showing a flow of aberration correction processing in the first embodiment of the present invention.

FIG. 5 shows an adjustment flow diagram of the aberration corrector 4 using the present invention.

First, the aberration coefficient operation unit 13 measures the aberration coefficients using the image data accumulated in the memory 12 (S201). In the correction target determination unit 14 that has received a set A{a1, a2 . . . } of aberration coefficients to be a measurement result, first, a set R{r1, r2 . . . } of influence values r on the image resolution is obtained using the set A (S202).

Here, the influence value r on the image resolution is a parameter representing the image resolution degradation due to the aberration. Between the aberration coefficient a and the influence value r on the image resolution, a relation of $r = w(x) * a$ exists. Here, w(x) is a weighting function representing the contribution of the aberration component to the image resolution and is obtained in advance.

The influence value r on the image resolution is hereinafter described as a resolution influence value r.

Figure 6A:
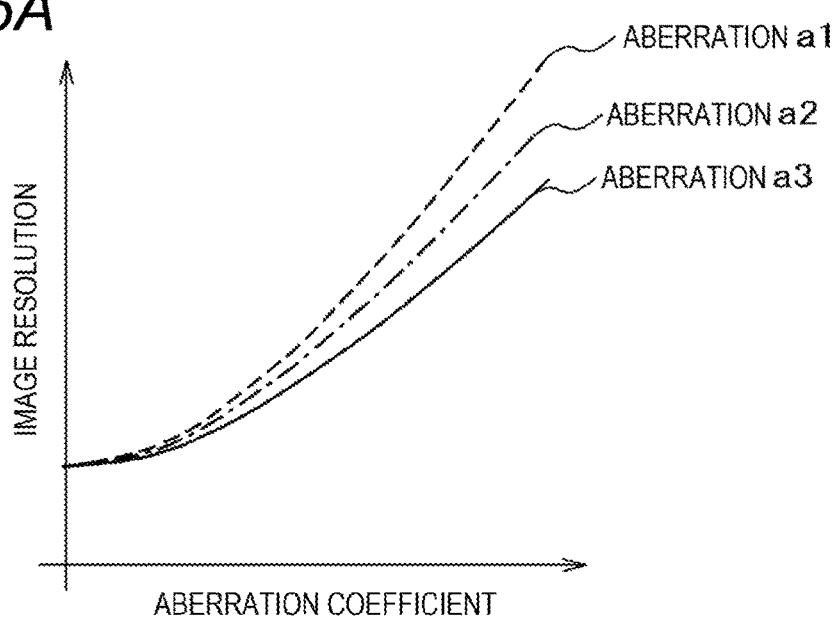
FIG. 6A is a graph showing a relation of an aberration coefficient and an image resolution for each aberration item in the first embodiment of the present invention.
Figure 6B:
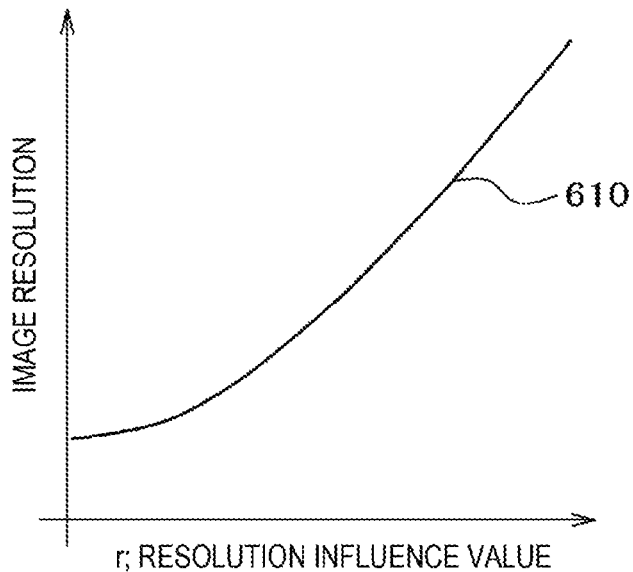
FIG. 6B is a graph showing a relation of resolution influence values and image resolutions obtained from aberration items in the first embodiment of the present invention.

FIGS. 6A and 6B show a relation between the aberration coefficients and the image resolution. FIG. 6A shows a relation between the aberration coefficients a1, a2, and a3 and the image resolution. Generally, when the aberration coefficient becomes larger, an influence on the beam blur becomes larger, so that the image resolution is degraded. When the aberration coefficient becomes smaller, the influence becomes smaller, so that the image resolution approaches a constant value (determined by diffraction, a light source diameter, device noise, or the like).

However, in the rotationally asymmetric aberrations, for example, the two-fold symmetric astigmatism A1, the three-fold symmetric astigmatism A2, the coma aberration B2, the four-fold symmetric astigmatism A3, the star aberration S3, and the like, because beam opening angle dependence, symmetry, and the like are different depending on the components thereof, the magnitude of the influence on blur of the beam is different for each component. Therefore, even if the aberration coefficients obtained as a result of aberration measurement have the same magnitude, image resolution degradation degrees are different when types of the aberrations are different.

On the other hand, FIG. 6B shows a relation between the resolution influence value r converted from the aberration coefficient and the image resolution. Here, by setting the above weighting function w(x) such that the relation between the resolution influence value r and the image resolution becomes constant regardless of the type of aberration, curves corresponding to the aberration coefficients a1, a2, and a3 of FIG. 6A are displayed in a state of overlapping one curve 610. Therefore, if the resolution influence value r is used, relative comparison between the aberrations is easy and it is possible to determine which aberration the resolution is deteriorated by.

In the present embodiment, the influence value (resolution influence value) r of each aberration on the image resolution is used. However, a numerical value that can compare the magnitudes of influences on the image degradation (broader concept including the image resolution) due to the aberrations between the different aberrations may be used. For example, a probe diameter, an influence value on a critical dimension value (CD value: length measurement value), or the like may be used.

Next, the correction target determination unit 14 determines whether or not adjustment of the aberration corrector 4 is necessary, using the obtained resolution influence value r (S203). When it is determined that correction is necessary (in the case of NO in S203), it is determined which aberration should be actually adjusted (S204), information of a type and an aberration amount of the correction target aberration is output as a result to the corrector power supply control value operation unit 15.

The corrector power supply control value operation unit 15 calculates a control value of the aberration corrector power supply 18 from the output result of the correction target determination unit 14 and the table 160 showing correspondence relation between the aberration amounts and the aberration corrector power supply values, acquired in advance and stored in the table storage unit 16 (S205) and outputs it to the aberration corrector power supply control unit 17. At this time, when there is a plurality of types of correction target aberrations, the calculation of the control value of the aberration corrector power supply 18 and the output to the aberration corrector power supply control unit 17 are performed sequentially from the aberration having the large resolution influence value r.

The aberration corrector power supply control unit 17 feeds back an operation result of the corrector power supply control value operation unit 15 to the aberration corrector power supply 18 and adjusts a voltage to be applied to the aberration corrector 4 by the aberration corrector power supply (S206) and then returns to S201 again. This is set as one step of the aberration correction and is performed until it is determined in S203 that the aberration correction is unnecessary (in the case of YES in S203).

FIG. shows an example of an aberration corrector adjustment necessity determination flow in S203 of FIG. 5. First, a total x of respective elements of the set R of resolution influence values r is obtained (S401). The total x is an index showing the magnitude of the influence on the image resolution by the entire aberration of the current optical system and a simple sum, a square sum, a mean value, or a root mean square of the elements of the set R is used.

Next, x is compared with a preset target value (S402). If x is less than the target value (the case of YES in S402), it is determined that a correction operation ends. If not so (in the case of NO in S402), it is determined that the correction operation is necessary and to determine the correction target, the procedure proceeds to the correction target determination in S204 of FIG. 5. The target value in S402 is determined in advance as the resolution influence value r corresponding to a desired image resolution.

Figure 8:
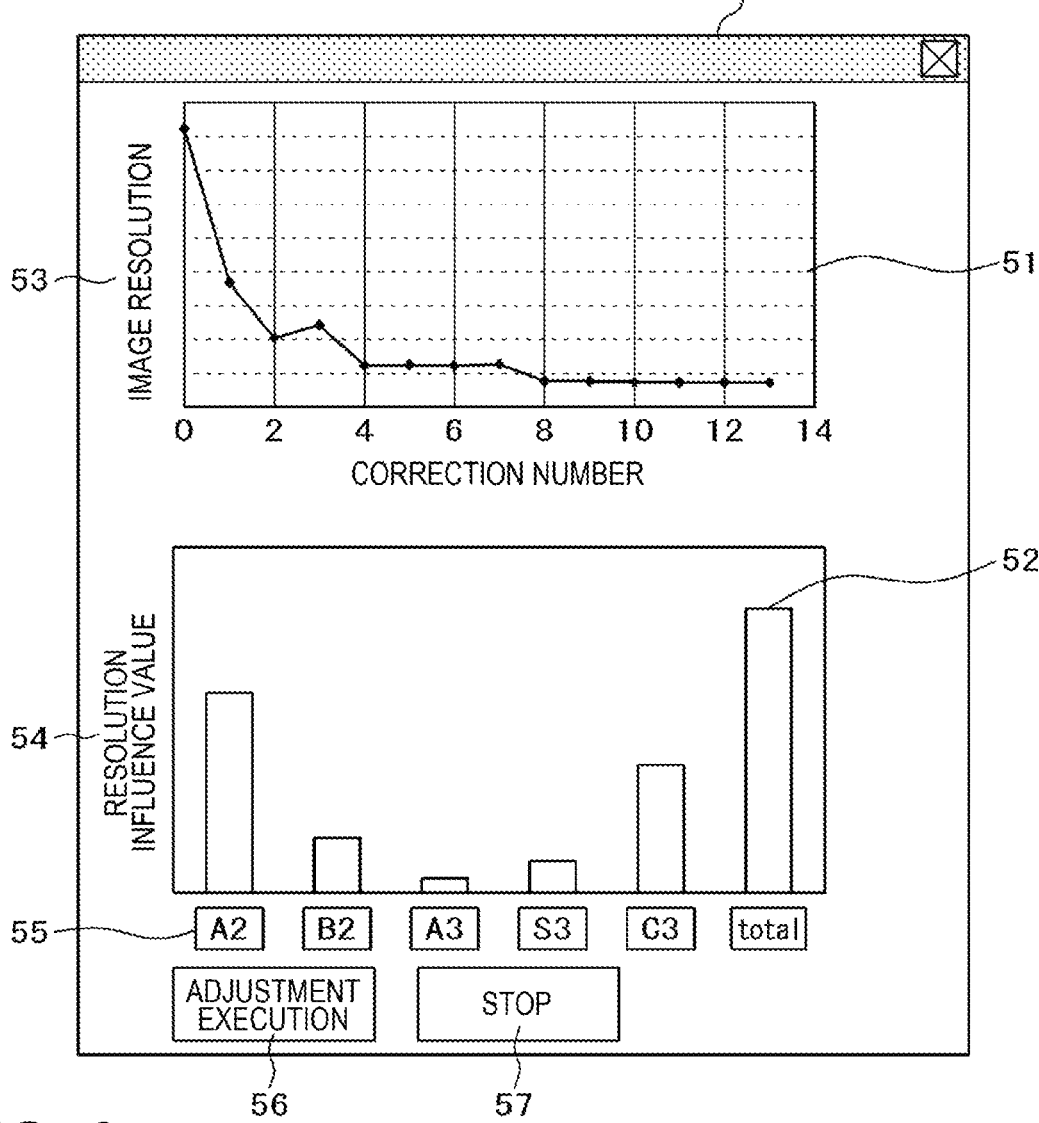
FIG. 8 is a front view of a GUI in the first embodiment of the present invention.

An example of a graphical user interface (GUI) of the present invention is shown in FIG. 8. For a user, an amount of aberrations included in the current optical system is shown using a GUI: 50 shown in FIG. 8.

In a graph 51, a past change in the image resolution 53 by the aberration correction using the aberration corrector 4 is displayed. The user can confirm the past change in the image resolution 53 by the aberration correction using the aberration corrector 4, by the graph 51.

A graph 52 is a graph displaying a value obtained by converting a most recent aberration measurement result into a resolution influence value 54 for each type of aberration. A2 represents a three-fold symmetric astigmatism, B2 represents a coma aberration, A3 represents a four-fold symmetric astigmatism, S3 represents a star aberration, C3 represents a spherical aberration, and total represents a total of respective aberrations. The user can confirm which aberration affects the image resolution degradation in the current optical system, by the graph 52 displayed on the GUI: 50.

Further, the user confirms states of the aberrations by the GUI: 50, confirms the image resolution 53 on the graph 51, and selects an aberration item to be adjusted, from the resolution influence values 54 for each of aberration items 55 displayed on the graph 52 as necessary, thereby correcting the selected aberration.

Specifically, the aberration item to be adjusted is selected by moving a cursor to a position of the aberration item having the largest resolution influence value 54 on the graph 52 and clicking it. Next, by clicking an adjustment execution button 56, the aberration item selected by the aberration corrector 4 can be adjusted according to S205 and S206 of the flow shown in FIG. 5, the aberration coefficient corrected in S201 can be measured, and the resolution influence value can be calculated in S202. Further, by clicking a stop button 57, the correction operation by the aberration corrector 4 can be stopped.

Figure 9:
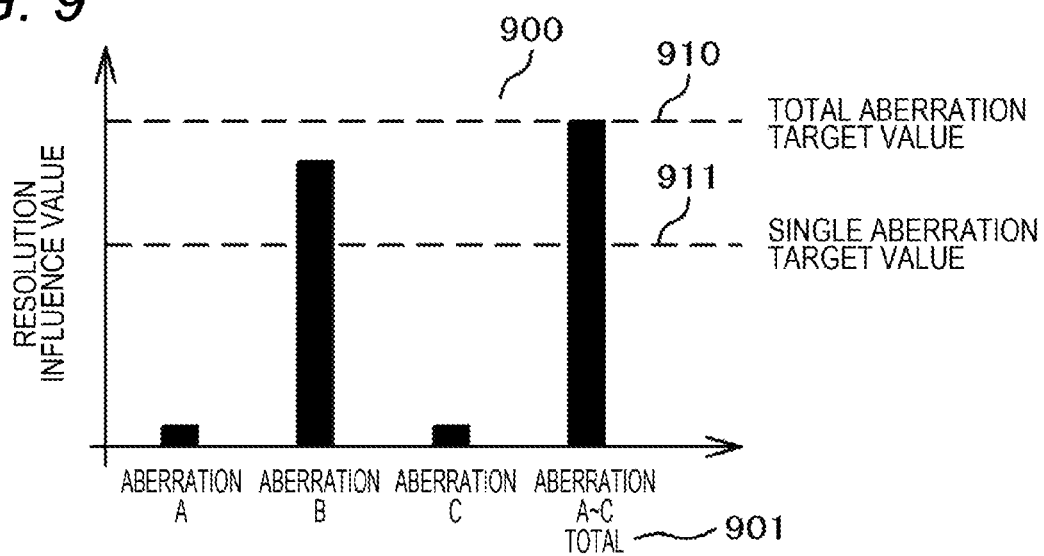
FIG. 9 is a graph showing a resolution influence value for each aberration item in the first embodiment of the present invention.

FIG. 9 is a graph 900 showing resolution influence values of respective aberrations and a total of respective aberrations. FIG. 9 shows a result of performing adjustment so that a total 901 of aberrations becomes a target value 910 or less. In this case, since the adjustment is performed without considering a balance between the individual aberrations, a contribution of the aberration to the resolution greatly varies between the individual aberrations and some aberrations exceed a single aberration target value 911. However, since it is not necessary to worry about the balance between the aberrations, the adjustment can be performed in a relatively short time so that the total 901 of aberrations falls within the target value.

According to the present embodiment, the resolution influence value is obtained for each aberration item, the order of aberration correction is determined, and the aberration correction is performed sequentially from the aberration having the large resolution influence value, so that the aberration correction can be more surely performed in a relatively short time. As a result, high-precision aberration correction can be surely performed and a higher quality image can be acquired in a relatively short time.

Further, according to the present embodiment, since it is possible to individually evaluate the influence of each measured aberration component on the beam diameter and the image resolution, it is possible to select and correct the aberration having a large effect on the image resolution improvement. As a result, the image resolution can be improved efficiently and the aberration corrector adjustment can be quickly completed.

Figure 7:
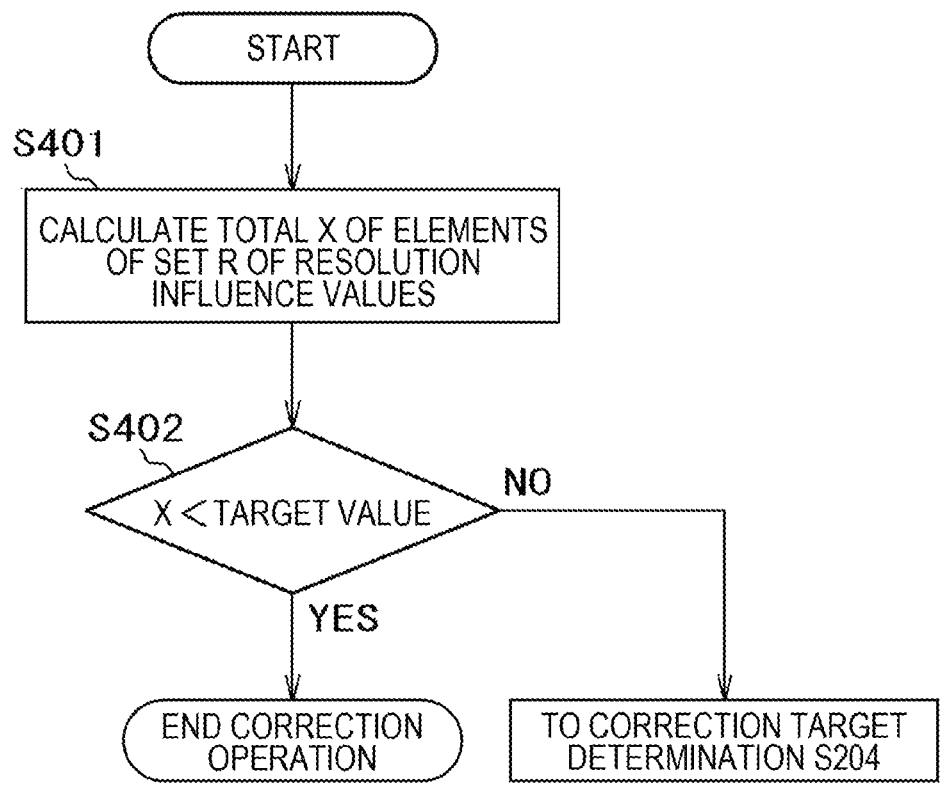
FIG. 7 is a diagram showing a flow of aberration correction processing in the first embodiment of the present invention and is a flowchart showing the details of S203 of the flowchart shown in FIG. 5.

Modification of First Embodiment in the detailed flow diagram of step S203 shown in FIG. 7, in step S402, the total x of respective elements of the set R of resolution influence values r is compared with the target value. When x is smaller than the target value (in the case of YES in S402), the correction operation ends.

However, the total x of respective elements of the set R is an index showing the magnitude of the influence on the image resolution by the entire aberration of the current optical system, and even when the entire aberration is smaller than the target value, the resolution influence value r may vary between the individual aberrations. In this case, by adjusting the aberration in which the resolution influence value r is relatively large and reducing the variation of the resolution influence value r between the aberrations, contributions of all the aberrations to the probe beam can be adjusted to the same extent and higher-precision aberration correction can be performed.

Therefore, in the present modification, first, the total x (the entire aberration) of respective elements (aberrations) of the set R is compared with the target value. When the total x becomes smaller than the target value, the resolution influence values r of the respective elements (aberrations) are compared and an end of the correction operation is determined.

Figure 10:
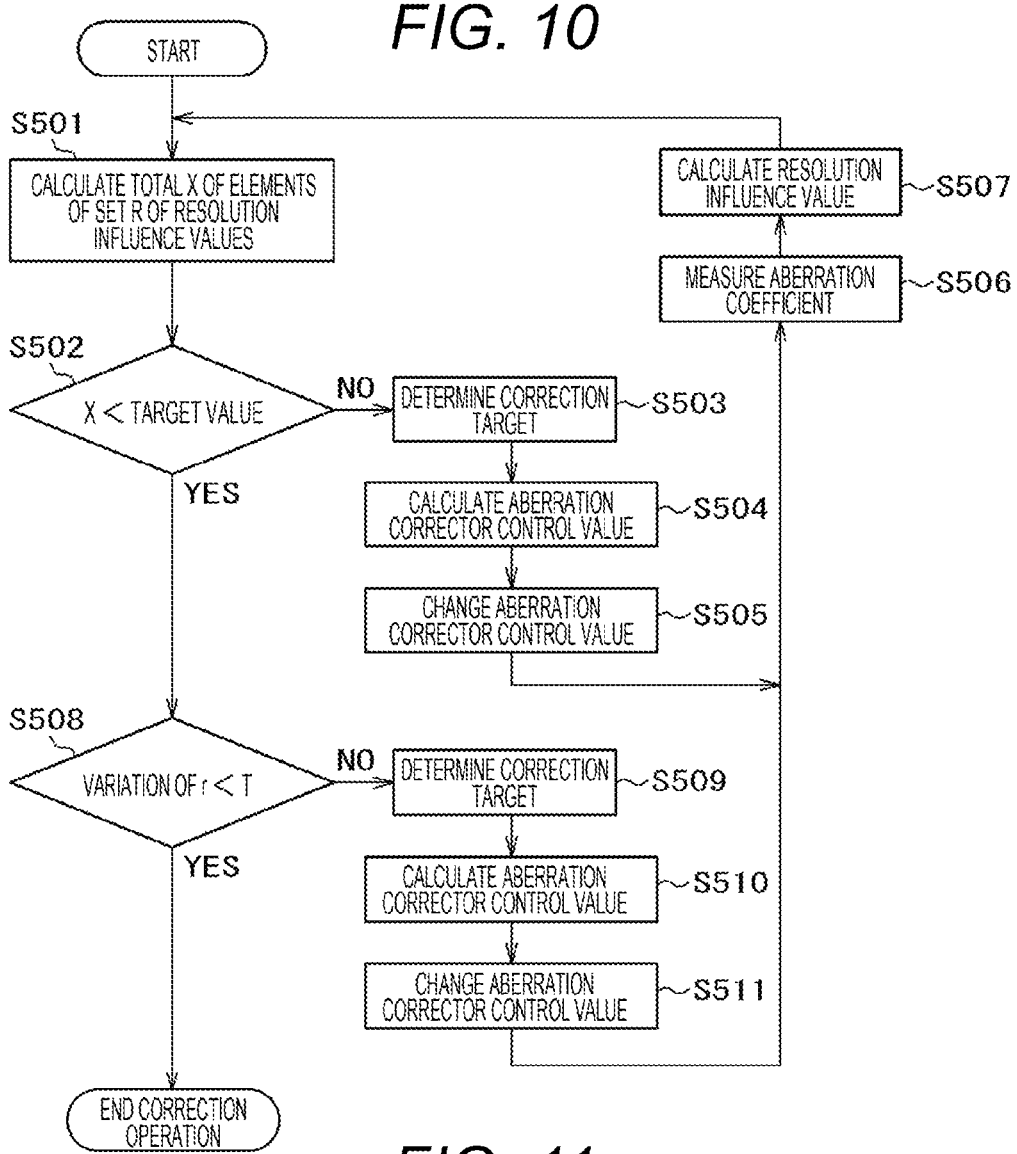
FIG. 10 is a flowchart showing a flow of aberration correction processing in a modification of the first embodiment of the present invention.

A flow diagram corresponding to the detailed flow diagram of step S203 shown in FIG. 7, based on the present modification, is shown in FIG. 10.

First, the total x of respective elements of the set R of resolution influence values r is obtained (S501). The total x is an index showing the magnitude of the influence on the image resolution by the entire aberration of the current optical system and a simple sum, a square sum, a mean value, or a root mean square of the elements of the set R is used.

Next, x is compared with the preset target value (S502). If x is not less than the target value (in the case of NO in S502), it is determined that the correction operation is necessary and the procedure proceeds to correction target determination S503 corresponding to S204 of FIG. 5 to determine the correction target. After executing aberration corrector control value calculation (S504) and aberration corrector control value deflection (S505) corresponding to S205 and S206 of FIG. 5, aberration coefficient measurement (S506) and resolution influence value calculation (S507) corresponding to S201 and S202 of FIG. 5 are executed and then, S501 is executed again. The target value in S502 is determined in advance as the resolution influence value r corresponding to a desired image resolution.

On the other hand, in S502, when the total x is less than the target value (in the case of YES in S502), the variation (for example, a variation of the resolution influence value r between the aberrations (for example, a difference between a maximum value and a minimum value of the resolution influence value r) is compared with the preset target value T (S508).

As a result of the comparison, when the variation of the resolution influence value r is not less than the preset target value T (in the case of NO in S508), the procedure proceeds to correction target determination S509 corresponding to S204 of FIG. 5 and aberration corrector control value calculation (S510) and aberration corrector control value deflection (S511) corresponding to S205 and S206 of FIG. 5 are executed. Then, aberration coefficient measurement (S506) and resolution influence value calculation (S507) corresponding to S201 and S202 of FIG. 5 are executed and S501 is executed again.

In S508, when the variation of the resolution influence value r between the aberrations is less than the target value T (in the case of YES in S508), the correction operation ends.

Figure 11:
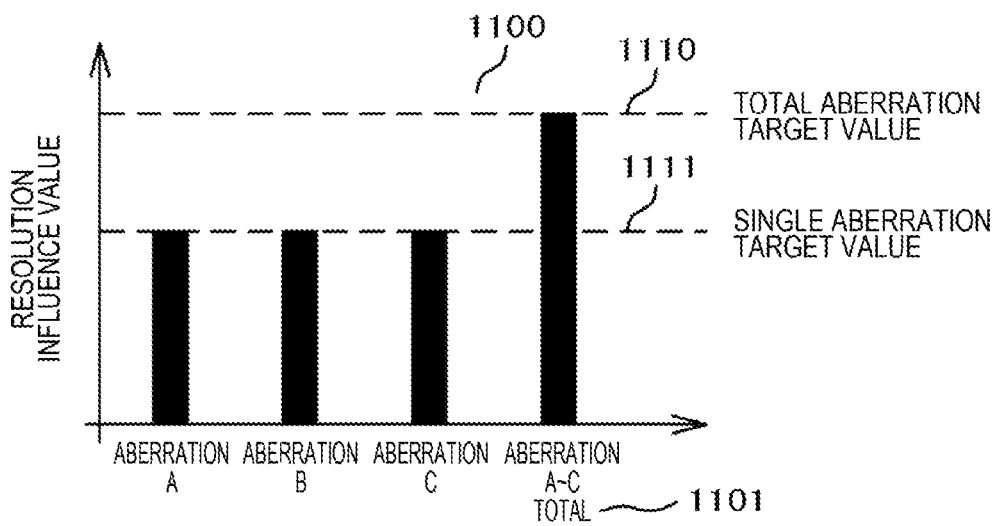
FIG. 11 is a graph showing a resolution influence value for each aberration item a modification of the first embodiment of the present invention.

FIG. 11 is a graph 1100 showing resolution influence values of respective aberrations and a total of respective aberrations, obtained by the present modification. FIG. 11 shows a state in which a total 1101 of aberrations is adjusted to be a target value 1110 or less and a resolution influence value of each aberration is adjusted to a nearly constant level close to a single aberration target value 1111, by a series of adjustments. As such, by performing adjustment so that contributions of all the aberrations to the resolution are about the same, as compared with the case of FIG. 9, it takes some time for the adjustment, but it is possible to acquire a higher-precision image with good image sharpness.

According to the present modification, in addition to the effects described in the first embodiment, the sum x of respective element of the set R of resolution influence values r can be adjusted and the resolution influence value r for each aberration can be adjusted to be approximately equal. Therefore, it is possible to perform aberration correction with higher precision and it is possible to acquire a higher quality image.

Second Embodiment

In the present embodiment, an example of the case in which the present invention is applied to a length measurement SEM for measuring a dimension of a pattern formed on a surface of a sample 8 from an SEM image of the sample 8 acquired by an SEM 110 and an image resolution is managed using a directional distribution of a probe beam is shown.

Figure 12:
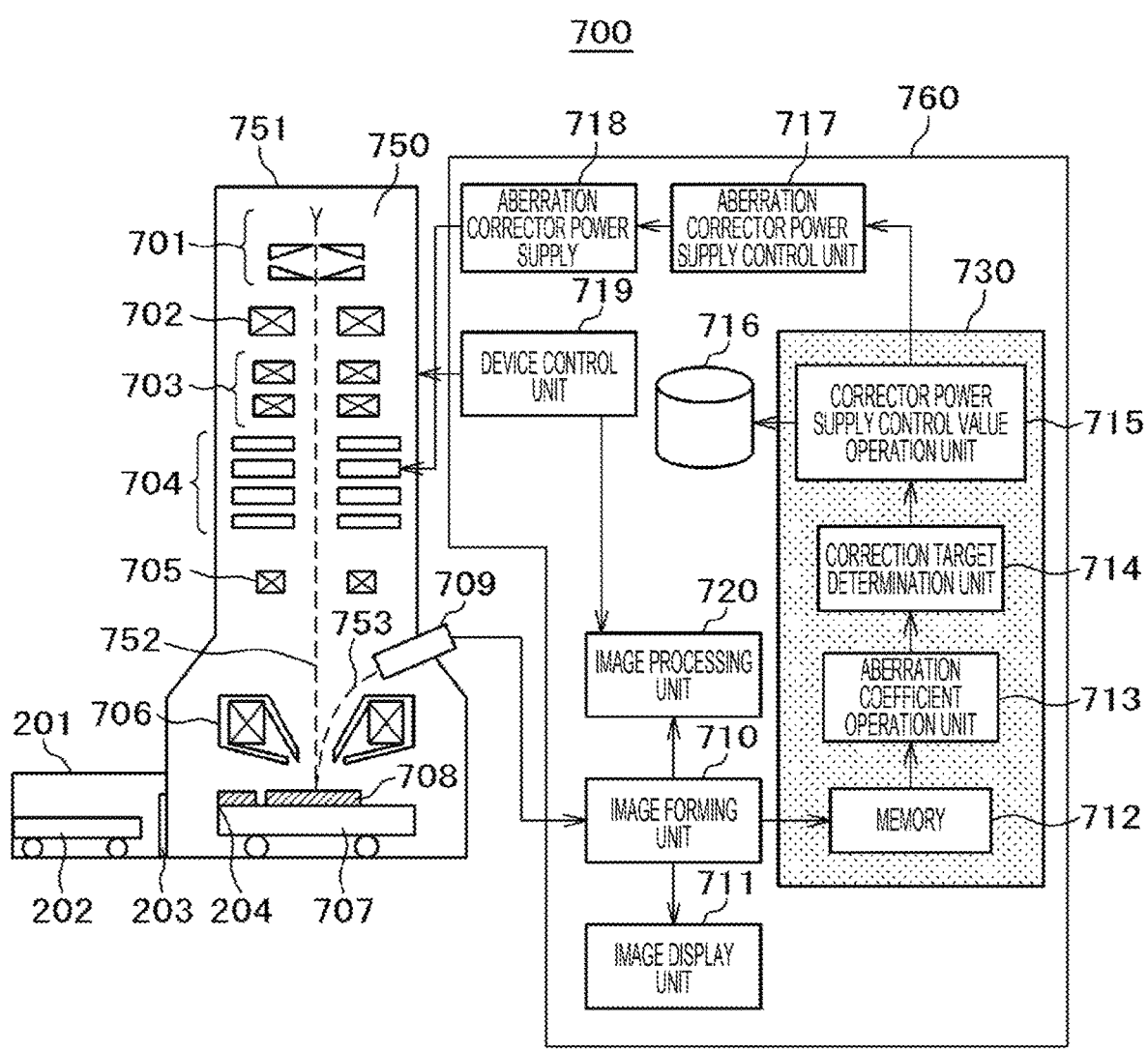
FIG. 12 is a block diagram showing a configuration of a charged particle beam device according to a second embodiment of the present invention.

FIG. 12 shows a diagram of a length measurement SEM system 700 mounted with an aberration corrector in the present embodiment. Similarly to the configuration shown in FIG. 1 described in the first embodiment, the length measurement SEM system 700 includes an SEM 750 mounted with an electromagnetic superposition type aberration corrector of a quadrupole-octupole system and a control system 760 thereof.

Similarly to the SEM 110 described in the first embodiment, the SEM 750 includes an electron gun 701, a condenser lens 702, a deflection coil 703, an aberration corrector 704, a scanning coil 705, an objective lens 706, and a sample stand 707 in a column 751.

Similarly to the control system 120 described in the first embodiment, the control system 760 includes a control computer 730, an image forming unit 710, an image display unit 711, an aberration corrector power supply control unit 717, an aberration corrector power supply 718, and a device control unit 719. Further, the control computer 730 includes a memory 712, an aberration coefficient operation unit 713, a correction target determination unit 714, and a corrector power supply control value operation unit 715 and is connected to a table storage unit 716.

In the above configuration, an electron beam 752 emitted from the electron gun 701 in the column 751 of the SEM 750 passes through the condenser lens 702 and the deflection coil 703 of a two-stage configuration and is then incident on the aberration corrector 704. After passing through the aberration corrector 704, the scanning coil 705, and the objective lens 706, the electron beam 752 is irradiated on a surface of a sample 708 placed on the sample stand 707 to scan the surface of the sample 708.

The length measurement SEM according to the present embodiment is a device that processes an image formed by the image forming unit 710 on the basis of a signal acquired by the SEM 750 by an image processing unit and performs pixel calculation, thereby measuring a distance between two points on measured image data.

In the length measurement SEM according to the present embodiment, a sample is introduced into the device from a sample preparation chamber 201 for introducing the sample into the column 751 by a sample conveyance mechanism 202. The sample preparation chamber 201 and an inner portion of the column 751 are separated by a gate valve 203. In addition, a standard sample 204 for measurement is provided on the sample stand 707 separately from the sample 708 to be observed. Since functions and operations of the other components are substantially the same as contents described in the first embodiment, the description thereof will be omitted.

Figure 13:
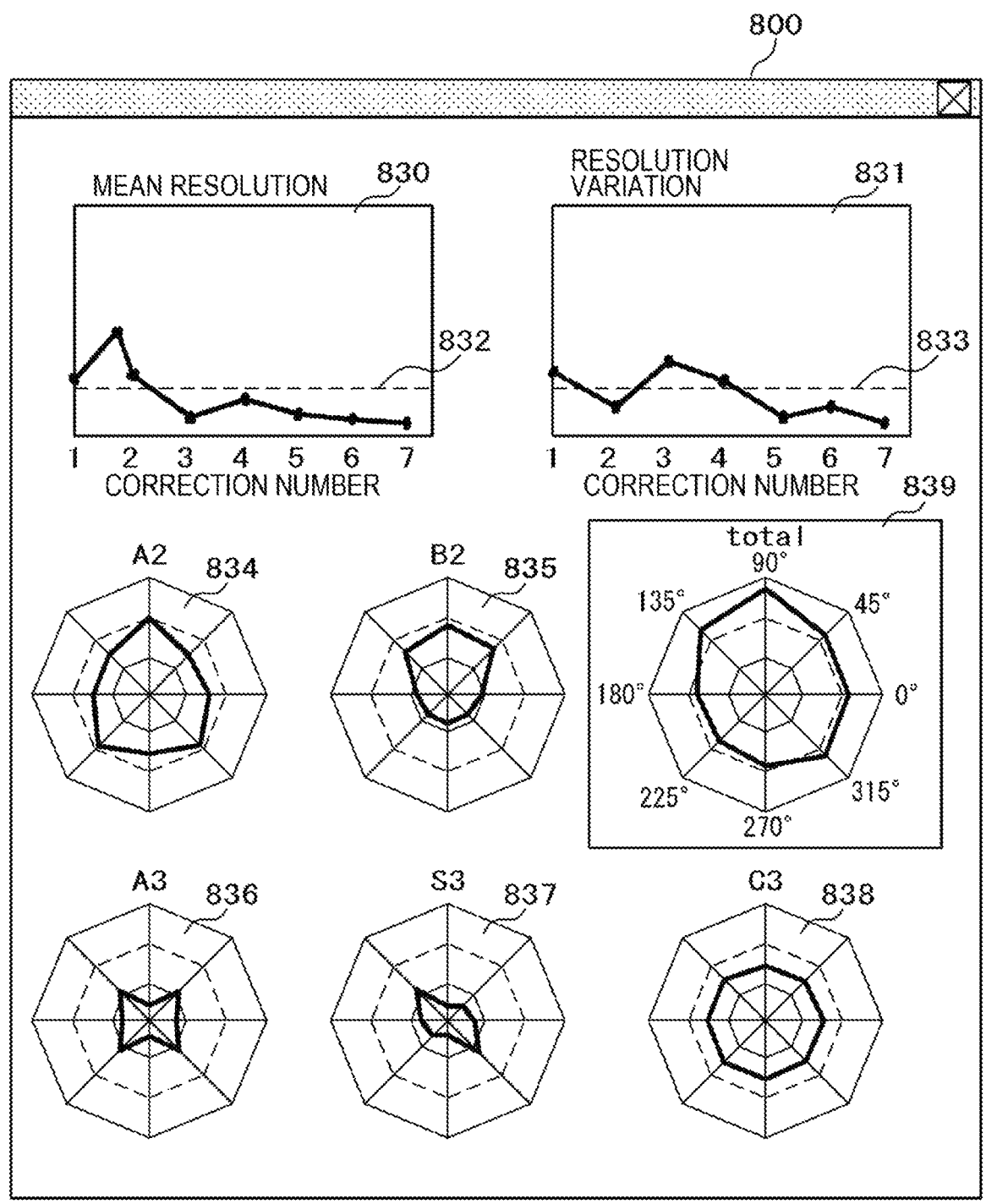
FIG. 13 is a front view of a GUI of the charged particle beam device according to the second embodiment of the present invention.

FIG. 13 shows an example of a GUI: 800 in the present embodiment.

In the present embodiment, a resolution influence value r is defined for each direction of an image in consideration of a difference in contribution to a beam divergence of each direction by a rotationally asymmetric aberration. Thereby, it is possible to obtain an influence on a resolution for each direction of the image by each aberration component. A state of the resolution for each direction of the image due to each aberration component in a most recent measurement result is displayed by 834 to 838 and a resolution for each direction of the image by all aberration components is displayed by 839. In the drawing, the resolution for each direction of the image is defined in eight directions of 0, 45, 90, 135, 180, 225, 270, and 315 degrees, but it may be defined by an arbitrary division number.

In the present embodiment, the aberration measurement is automatically performed at constant intervals and the state of the resolution for each direction of the image by the aberration obtained from the measurement result is shown on the GUI, so that a user can monitor a state of the device.

In an image mean resolution transition graph 830, a temporal transition state of a mean value of the resolution for each direction of the image and an allowable line (832) of the image mean resolution are shown together. In an image resolution variation transition graph 831, a variation of the resolution for each direction of the image and an allowable line (833) of the variation of the resolution for each direction of the image are shown together. By referring to the above information on the GUI: 800, the user can grasp a state change or state abnormality of the device, readjustment timing of the aberration corrector, and the like.

The present invention is not limited to the embodiments described above and various modifications are included in the present invention. For example, the embodiments are described in detail to facilitate the description of the present invention and are not limited to including all of the described configurations. In addition, a part of the configurations of the certain embodiment can be replaced by the configurations of another embodiment or the configurations of another embodiment can be added to the configurations of the certain embodiment. In addition, for a part of the configurations of the individual embodiments, addition, removal, and replacement of other configurations can be performed.

In the present embodiment, since there is no restriction on an aberration measurement method, an application of the case where the aberration corrector is mounted on other charged particle beam devices, for example, a transmission electron microscope, a scanning transmission electron microscope, a focused ion beam device, and the like is also enabled. The aberration corrector can be applied to an aberration corrector using a multi-stage multi-pole such as a hexapole type, an electromagnetic field superimposition quadrupole-electric field octupole type, an electromagnetic superposition quadrupole-magnetic field octupole type, an all stage electrostatic type, and an all stage magnetic field type and the aberration to be corrected can be applied to both a chromatic aberration and a geometric aberration.

In addition, a part or all of the individual configurations, functions, processing units, and processing mechanisms may be designed by integrated circuits and may be realized by hardware. In addition, the individual configurations and functions may be realized by software by analyzing programs for realizing the functions by a processor and executing the programs by the processor. Information such as the programs, the tables, and the files for realizing the individual functions may be stored in a recording device such as a memory, a hard disk, and a solid state drive (SSD) or a recording medium such as an IC card, an SD card, and a DVD. In addition, only control lines or information lines necessary for explanation are illustrated and the control lines or information lines do not mean all control lines or information lines necessary for a product. In actuality, almost all configurations may be connected to each other.

REFERENCE SIGNS LIST 1, 701 electron gun
2, 702 condenser lens
3, 703 deflection coil
4, 704 aberration corrector
5, 705 scanning coil
6, 706 objective lens
7, 707 sample stand
8, 708 sample
9, 709 detector
10, 710 image forming unit
11, 711 image display unit
12, 712 memory
13, 713 aberration coefficient operation unit
14, 714 aberration correction target determination unit
15, 715 corrector power supply control value operation unit
16, 716 table storage unit
17, 717 aberration corrector power supply control unit
18, 718 aberration corrector power supply
100 SEM system
110, 750 SEM
111, 751 column
120, 760 control system
121, 730 control computer
720 image processing unit

The invention claimed is:

1. A charged particle beam device, comprising:
a charged particle source which generates a primary charged particle beam;
an aberration correction optical system which corrects aberrations of the primary charged particle beam generated from the charged particle source;
a detection unit which detects a secondary charged particle generated from a sample irradiated with the primary charged particle beam whose aberrations have been corrected by the aberration correction optical system;
an image forming unit which forms a charged particle image of the sample from a signal obtained by detecting the secondary charged particle by the detection unit;
an aberration correction amount calculation unit which processes the charged particle image formed by the image forming unit, separates aberrations having different symmetries in the primary charged particle beam, selects an aberration to be preferentially corrected from the separated aberrations, and calculates a correction amount of the aberration correction optical system for correcting the selected aberration; and
an aberration correction optical system control unit which controls the aberration correction optical system on the basis of the correction amount calculated by the aberration correction amount calculation unit,
wherein the aberration correction amount calculation unit includes an aberration coefficient operation unit which processes the charged particle image formed by the image forming unit, separates the aberrations having the different symmetries in the primary charged particle beam, and obtains an aberration coefficient for each of the separated aberrations, a correction target determination unit which determines an aberration to be corrected on the basis of the aberration coefficient for each aberration obtained by the aberration coefficient operation unit; and an aberration correction optical system correction amount calculation unit which calculates a correction amount of the aberration correction optical system for correcting the aberration determined as a correction target by the correction target determination unit, and
wherein the correction target determination unit obtains resolution influence values to be parameters representing image resolution degradations by the aberrations, on the basis of the aberration coefficients obtained by the aberration coefficient operation unit with respect to the separated aberrations, and determines the aberration to be corrected so that a total of resolution influence values for each aberration becomes smaller than a preset value.

2. The charged particle beam device according to claim 1, wherein the correction target determination unit controls the aberration correction optical system so that an aberration having a large effect on image resolution improvement by correction among the separated aberrations is determined as a correction target aberration and is preferentially corrected.

3. The charged particle beam device according to claim 1, wherein the correction target determination unit determines the aberration to be corrected so that the total of resolution influence values for each aberration becomes smaller than the preset value and determines the aberration to be corrected so that a difference between the resolution influence values for each aberration becomes smaller than a preset value.

4. A charged particle beam device, comprising:
a charged particle source which generates a primary charged particle beam;
an aberration correction optical system including a multipole lens which corrects aberrations of the primary charged particle beam generated from the charged particle source;

a detection unit which detects a secondary charged particle generated from a sample irradiated with the primary charged particle beam whose aberrations have been corrected by the aberration correction optical system;

an image forming unit which forms a charged particle image of the sample from a signal obtained by detecting the secondary charged particle by the detection unit;

an aberration correction amount calculation unit which processes the charged particle image formed by the image forming unit, extracts an aberration to be preferentially corrected in the aberration correction optical system, and calculates a correction amount of the extracted aberration to be preferentially corrected;

an aberration correction optical system control unit which controls the aberration correction optical system on the basis of the correction amount calculated by the aberration correction amount calculation unit; and an image processing unit which processes the charged particle image formed by the image forming unit from the signal obtained by detecting the secondary charged particle generated from the sample irradiated with the primary charged particle beam having passed through the aberration correction optical system controlled by the aberration correction optical system control unit by the detection unit and measures a dimension of a pattern formed on the sample, wherein the aberration correction amount calculation unit includes an aberration coefficient operation unit which processes the charged particle image formed by the image forming unit, separates aberrations having different symmetries in the primary charged particle beam, and obtains an aberration coefficient for each of the separated aberrations, a correction target determination unit which determines an aberration to be corrected on the basis of the aberration coefficient for each aberration obtained by the aberration coefficient operation unit, and an aberration correction optical system correction amount calculation unit which calculates a correction amount of the aberration correction optical system for correcting the aberration determined as a correction target by the correction target determination unit, and wherein the correction target determination unit obtains resolution influence values to be parameters representing image resolution degradations by the aberrations, on the basis of the aberration coefficients obtained by the aberration coefficient operation unit with respect to the separated aberrations, and determines the aberration to be corrected so that a total of resolution influence values for each aberration becomes smaller than a preset value.

5. The charged particle beam device according to claim 4, wherein the correction target determination unit controls the aberration correction optical system so that an aberration having a large effect on image resolution improvement by correction among the separated aberrations is determined as a correction target aberration and is preferentially corrected.

6. The charged particle beam device according to claim 4, wherein the correction target determination unit determines the aberration to be corrected so that the total of resolution influence values for each aberration becomes smaller than the preset value and determines the aberration to be corrected so that a difference between the resolution influence values for each aberration becomes smaller than a preset value.

7. An aberration correction method for a charged particle beam device, comprising:

causing a detector to detect a secondary charged particle generated from a sample irradiated with a primary charged particle beam which has been generated from a charged particle source of the charged particle beam device and has passed through an aberration correction optical system;

causing an image forming unit to form a charged particle image of the sample from a signal obtained by detecting the secondary charged particle by the detector;

causing an aberration correction amount calculation unit to process the charged particle image formed by the image forming unit, extract an aberration to be preferentially corrected in the aberration correction optical system, and calculate a correction amount of the extracted aberration to be preferentially corrected; and controlling the aberration correction optical system on the basis of the correction amount of the aberration to be preferentially corrected, which has been calculated by the aberration correction amount calculation unit, wherein causing the aberration correction amount calculation unit to process the charged particle image, extract the aberration to be preferentially corrected by the aberration correction optical system, and calculate the correction amount of the extracted aberration to be preferentially corrected is performed by separating aberrations having different symmetries in the primary charged particle beam from the charged particle image and obtaining aberration coefficients, obtaining resolution influence values to be parameters representing image resolution degradations by the aberrations for each aberration, on the basis of the obtained aberration coefficients, checking whether or not a total of resolution influence values obtained for each aberration is larger than a preset value, extracting an aberration having the largest resolution influence value as the aberration to be preferentially corrected, in a case where the total of resolution influence values is larger than the preset value, and calculating a correction amount of the aberration correction optical system for correcting the extracted aberration to be preferentially corrected.

8. The aberration correction method for the charged particle beam device according to claim 7, wherein, in a case where, as a result of checking whether or not the total of resolution influence values obtained for each aberration is larger than the preset value, the total of resolution influence values is smaller than the preset value, it is checked whether or not a variation of the resolution influence value for each aberration falls within a preset range and when the variation of the resolution influence value for each aberration does not fall within the preset range, an aberration having a large resolution influence value is extracted as the aberration to be preferentially corrected and a correction amount of the aberration correction optical system for correcting the extracted aberration to be preferentially corrected is calculated.

9. A charged particle beam device, comprising:
a charged particle source which generates a primary charged particle beam;
an aberration correction optical system which corrects aberrations of the primary charged particle beam generated from the charged particle source;

a detection unit which detects a secondary charged particle generated from a sample irradiated with the primary charged particle beam whose aberrations have been corrected by the aberration correction optical system;

an image forming unit which forms a charged particle image of the sample from a signal obtained by detecting the secondary charged particle by the detection unit;

an aberration correction amount calculation unit which processes the charged particle image formed by the image forming unit, separates aberrations having different symmetries in the primary charged particle beam, selects an aberration to be preferentially corrected from the separated aberrations, and calculates a correction amount of the aberration correction optical system for correcting the selected aberration; and an aberration correction optical system control unit which controls the aberration correction optical system on the basis of the correction amount calculated by the aberration correction amount calculation unit, wherein the aberration correction amount calculation unit includes an aberration coefficient operation unit which processes the charged particle image formed by the image forming unit, separates the aberrations having the different symmetries in the primary charged particle beam, and obtains an aberration coefficient for each of the separated aberrations, a correction target determination unit which determines an aberration to be corrected on the basis of the aberration coefficient for each aberration obtained by the aberration coefficient operation unit; and an aberration correction optical system correction amount calculation unit which calculates a correction amount of the aberration correction optical system for correcting the aberration determined as a correction target by the correction target determination unit;

wherein the correction target determination unit obtains resolution influence values to be parameters representing image resolution degradations by the aberrations, on the basis of the aberration coefficients obtained by the aberration coefficient operation unit with respect to the separated aberrations, and determines the aberration to be corrected so that a total of resolution influence values for each aberration becomes smaller than a preset value; and wherein the correction target determination unit determines the aberration to be corrected so that the total of resolution influence values for each aberration becomes smaller than the preset value and determines the aberration to be corrected so that a difference between the resolution influence values for each aberration becomes smaller than a preset value.

10. The charged particle beam device according to claim 9, wherein the correction target determination unit controls the aberration correction optical system so that an aberration having a large effect on image resolution improvement by correction among the separated aberrations is determined as a correction target aberration and is preferentially corrected.

11. A charged particle beam device, comprising:
a charged particle source which generates a primary charged particle beam; an aberration correction optical system including a multi-pole lens which corrects aberrations of the primary charged particle beam generated from the charged particle source;
a detection unit which detects a secondary charged particle generated from a sample irradiated with the primary charged particle beam whose aberrations have been corrected by the aberration correction optical system;

an image forming unit which forms a charged particle image of the sample from a signal obtained by detecting the secondary charged particle by the detection unit;

an aberration correction amount calculation unit which processes the charged particle image formed by the image forming unit, extracts an aberration to be preferentially corrected in the aberration correction optical system, and calculates a correction amount of the extracted aberration to be preferentially corrected;

an aberration correction optical system control unit which controls the aberration correction optical system on the basis of the correction amount calculated by the aberration correction amount calculation unit; and an image processing unit which processes the charged particle image formed by the image forming unit from the signal obtained by detecting the secondary charged particle generated from the sample irradiated with the primary charged particle beam having passed through the aberration correction optical system controlled by the aberration correction optical system control unit by the detection unit and measures a dimension of a pattern formed on the sample, wherein the aberration correction amount calculation unit includes an aberration coefficient operation unit which processes the charged particle image formed by the image forming unit, separates aberrations having different symmetries in the primary charged particle beam, and obtains an aberration coefficient for each of the separated aberrations, a correction target determination unit which determines an aberration to be corrected on the basis of the aberration coefficient for each aberration obtained by the aberration coefficient operation unit, and an aberration correction optical system correction amount calculation unit which calculates a correction amount of the aberration correction optical system for correcting the aberration determined as a correction target by the correction target determination unit, wherein the correction target determination unit obtains resolution influence values to be parameters representing image resolution degradations by the aberrations, on the basis of the aberration coefficients obtained by the aberration coefficient operation unit with respect to the separated aberrations, and determines the aberration to be corrected so that a total of resolution influence values for each aberration becomes smaller than a preset value, and wherein the correction target determination unit determines the aberration to be corrected so that the total of resolution influence values for each aberration becomes smaller than the preset value and determines the aberration to be corrected so that a difference between the resolution influence values for each aberration becomes smaller than a preset value.

12. The charged particle beam device according to claim 11, wherein the correction target determination unit controls the aberration correction optical system so that an aberration having a large effect on image resolution improvement by correction among the separated aberrations is determined as a correction target aberration and is preferentially corrected.

* * * * *